United States Patent [19]
Staudte

[11] Patent Number: 5,436,523
[45] Date of Patent: Jul. 25, 1995

[54] HIGH FREQUENCY CRYSTAL RESONATOR

[75] Inventor: Juergen H. Staudte, Cedar City, Utah

[73] Assignee: Avance Technology, Cedar City, Utah

[21] Appl. No.: 252,050

[22] Filed: May 31, 1994

Related U.S. Application Data

[63] Continuation of Ser. No. 973,025, Nov. 6, 1992, abandoned.

[51] Int. Cl.$^6$ ............................................. H01L 41/08
[52] U.S. Cl. ..................... 310/348; 310/340; 310/368
[58] Field of Search .............. 310/324, 330, 340, 348, 310/366, 368

[56] References Cited

U.S. PATENT DOCUMENTS

| | | | |
|---|---|---|---|
| 2,478,223 | 8/1949 | Argabrite | 310/345 |
| 3,721,841 | 3/1973 | Wilson | 310/366 |
| 3,798,473 | 3/1974 | Murayama et al. | 310/334 |
| 3,891,873 | 6/1975 | Yanagisawa et al. | 310/366 |
| 4,282,454 | 8/1981 | Wakat et al. | 310/348 |
| 4,379,247 | 4/1983 | Mattuschka | 310/368 |
| 4,445,256 | 5/1984 | Huquenin et al. | 310/340 |
| 4,451,754 | 5/1984 | Stolz et al. | 310/348 |
| 4,494,409 | 1/1985 | Kondo et al. | 73/651 |
| 4,507,705 | 3/1985 | Hoshino et al. | 361/283 |
| 4,652,787 | 3/1987 | Zingg | 310/348 |
| 4,916,413 | 4/1990 | Nakayama et al. | 331/68 |
| 5,023,503 | 6/1991 | Legge et al. | 310/348 |
| 5,162,691 | 11/1992 | Mariani et al. | 310/324 |
| 5,285,127 | 2/1994 | Egley et al. | 310/366 |

FOREIGN PATENT DOCUMENTS

| | | | |
|---|---|---|---|
| 0035593 | 3/1977 | Japan | 310/348 |
| 0056882 | 5/1977 | Japan | 310/348 |
| 0071189 | 6/1977 | Japan | 310/348 |
| 0054594 | 4/1979 | Japan | 310/348 |
| 0206114 | 12/1982 | Japan | 310/340 |
| 0200616 | 11/1983 | Japan | 310/340 |
| 0212219 | 12/1983 | Japan | 310/348 |
| 0218214 | 12/1983 | Japan | 310/348 |
| 2067009 | 7/1981 | United Kingdom | 310/340 |

*Primary Examiner*—Thomas M. Dougherty
*Attorney, Agent, or Firm*—Flehr, Hohbach, Test, Albritton & Herbert

[57] ABSTRACT

A high frequency oscillator with operating frequencies of 30 MHz or greater having an etched quartz thickness shear resonator with resonating means. The resonator has a support structure and a much thinner resonating membrane cantilevered from the support structure. In a preferred embodiment, the design of the support structure is such that a sloped edge is provided between the support structure and the membrane, thus facilitating the application of electrode resonating means extending from the support structure to the membrane. In another preferred embodiment, a plurality of resonators having a support structure and cantilevered membrane with at least one sloped edge are formed on a quartz wafer in a manner similar to semiconductor chip fabrication.

31 Claims, 5 Drawing Sheets

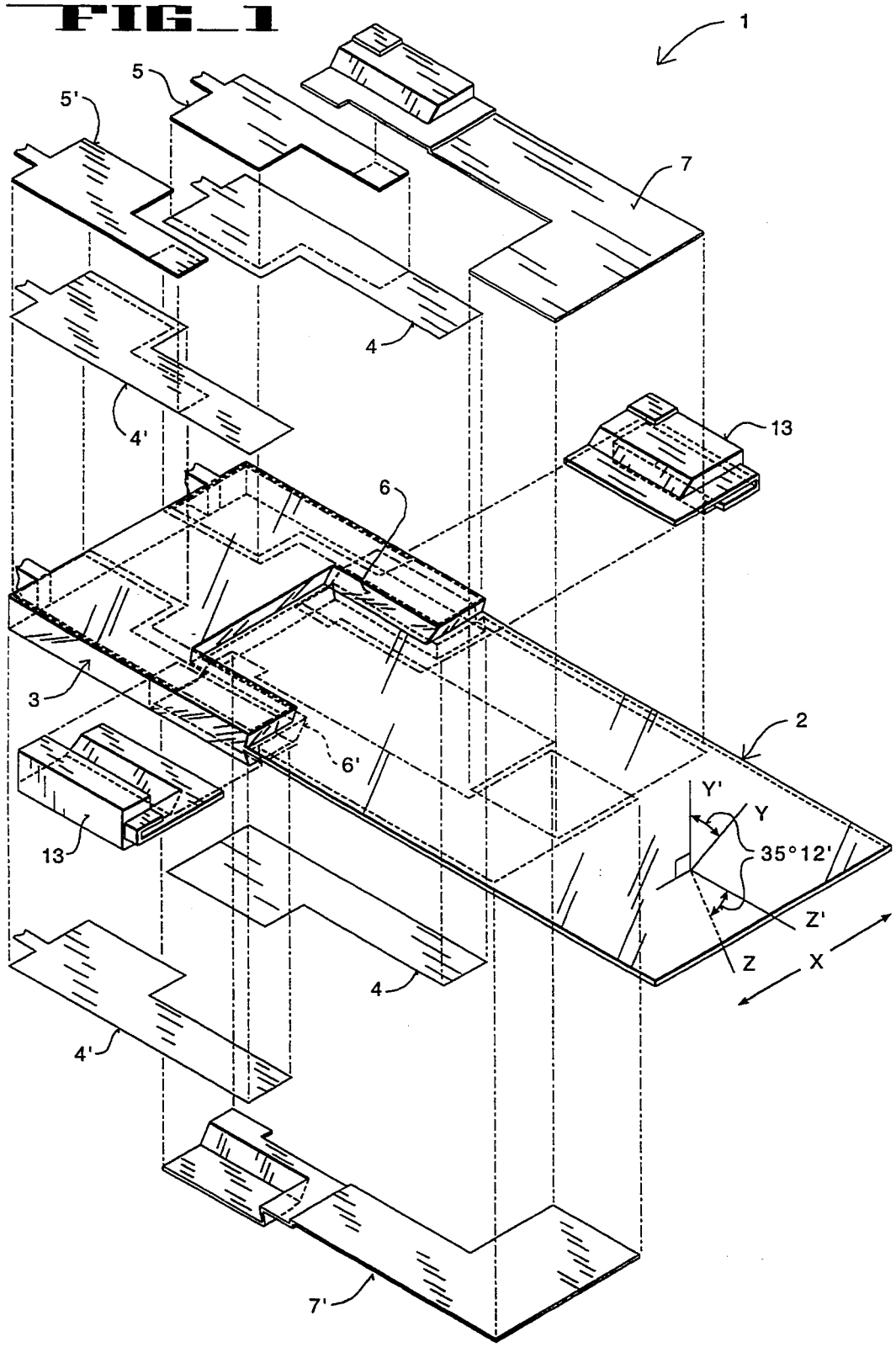

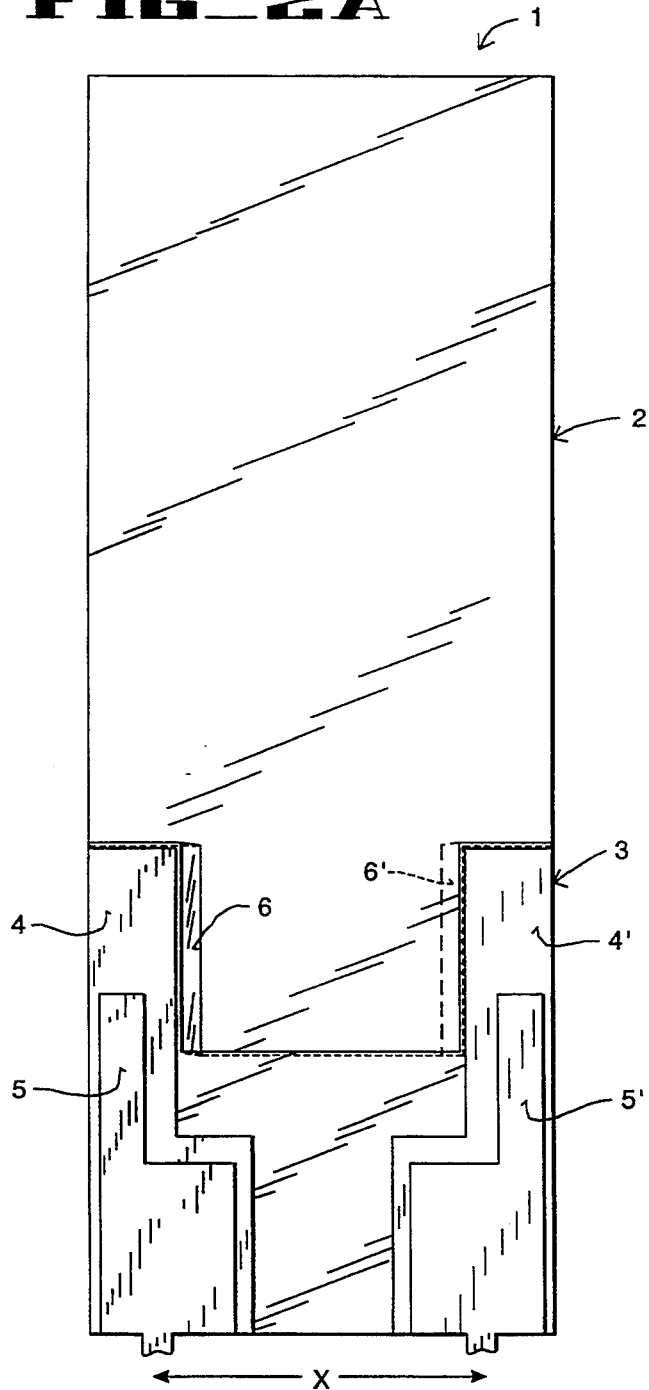
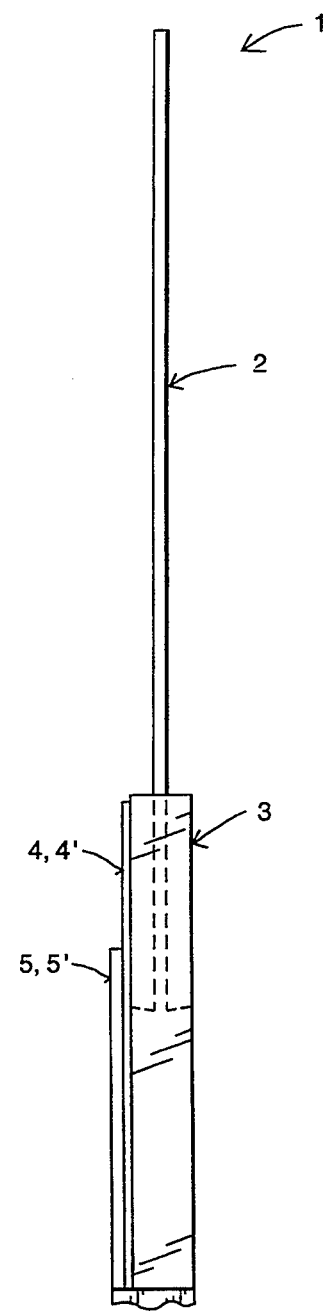
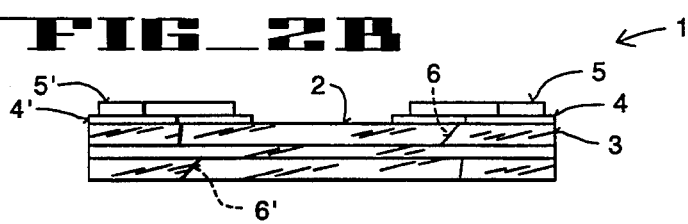

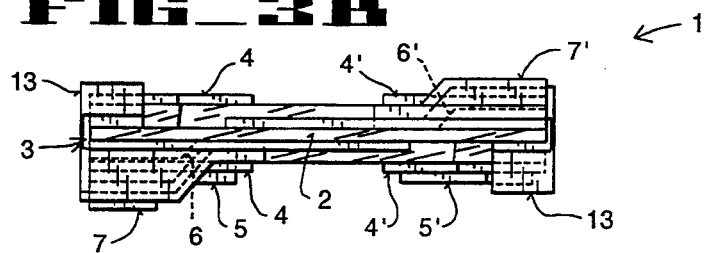
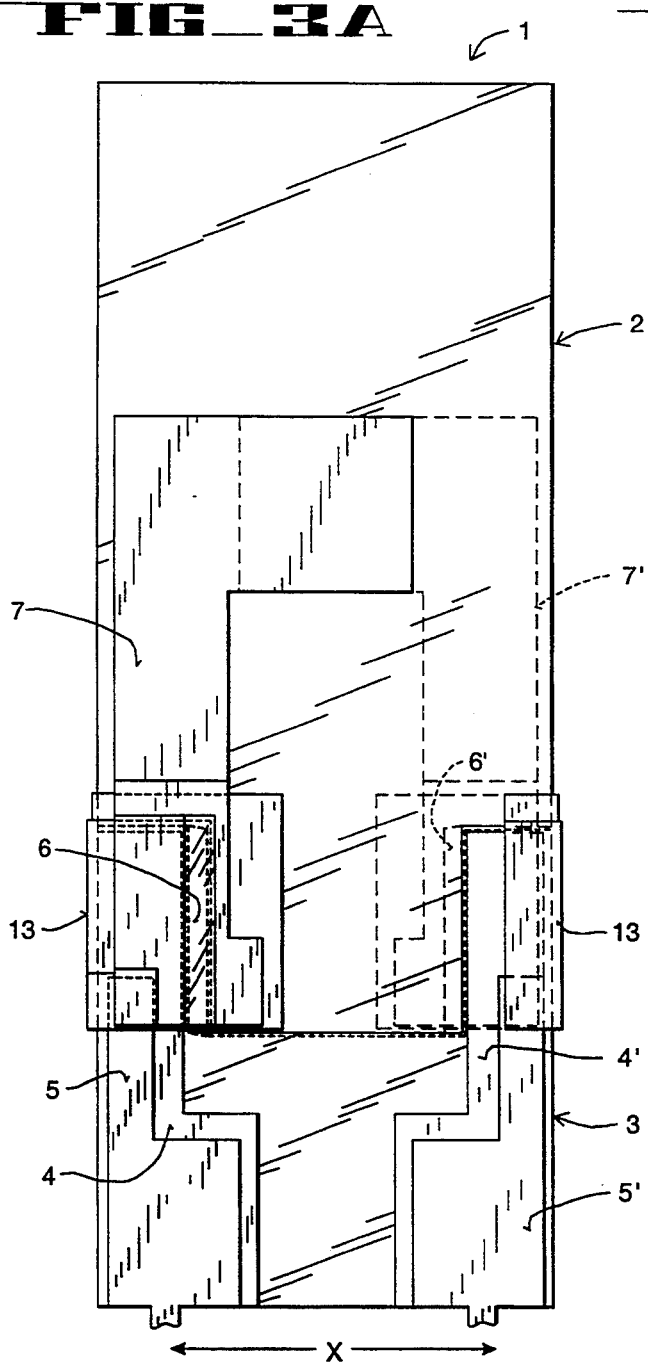
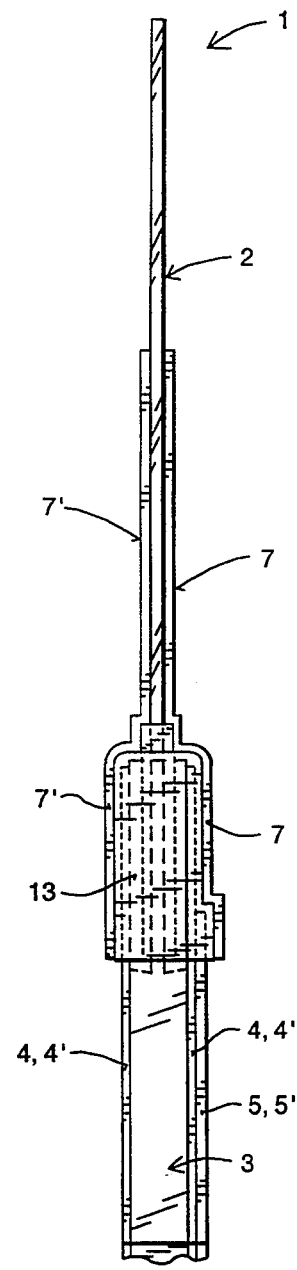

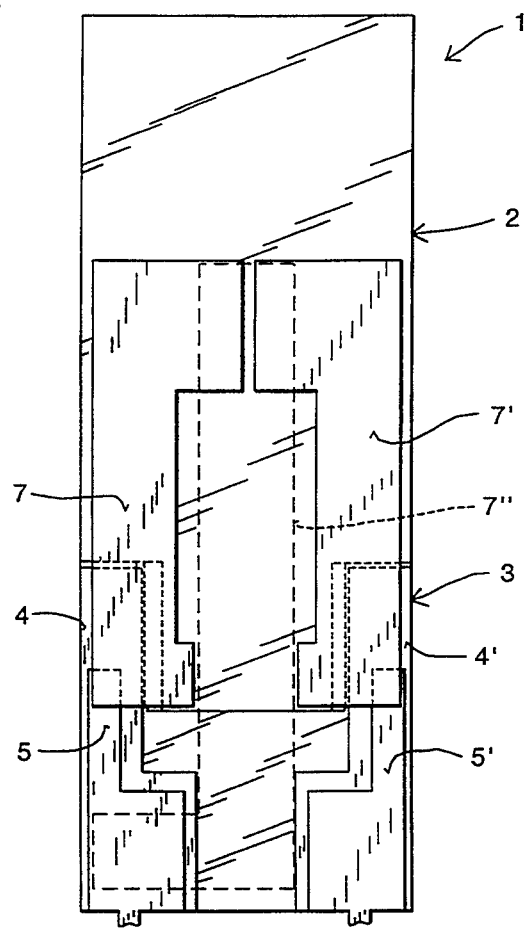
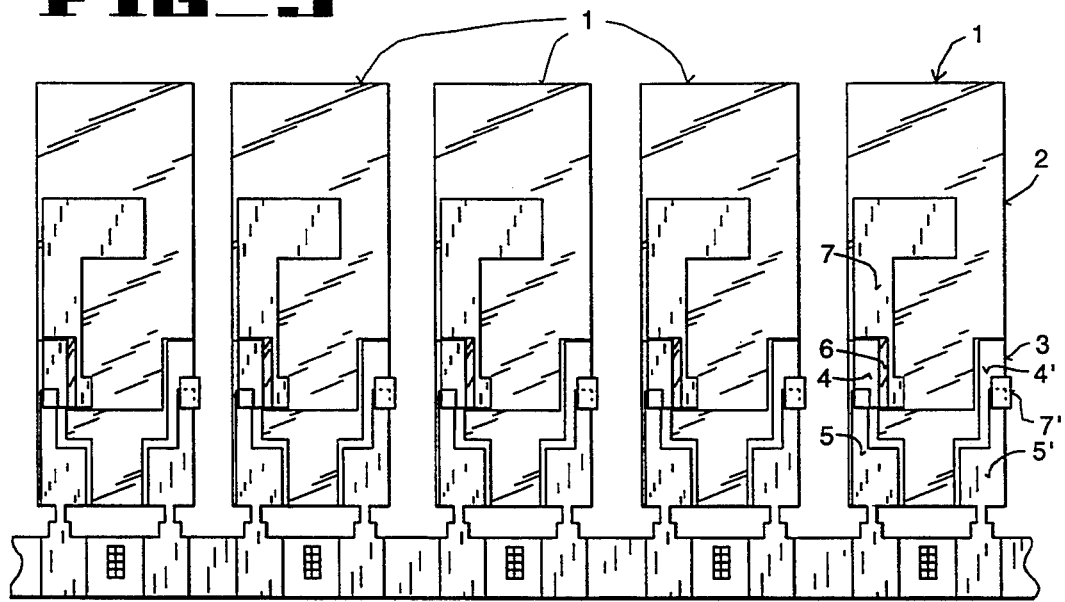

FIG_6
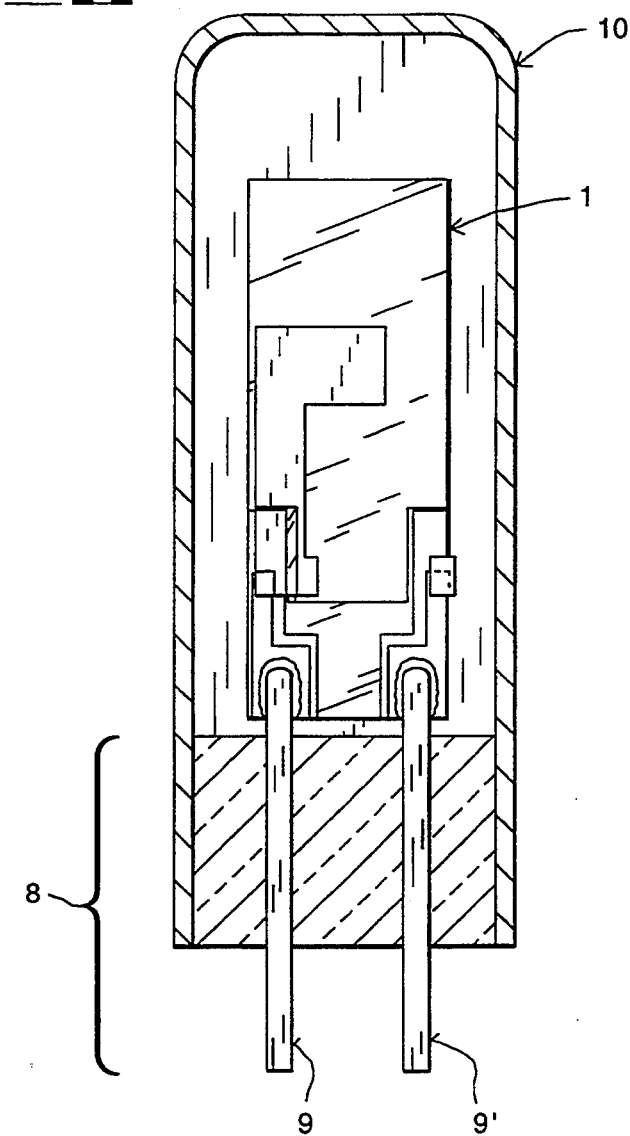
FIG_7
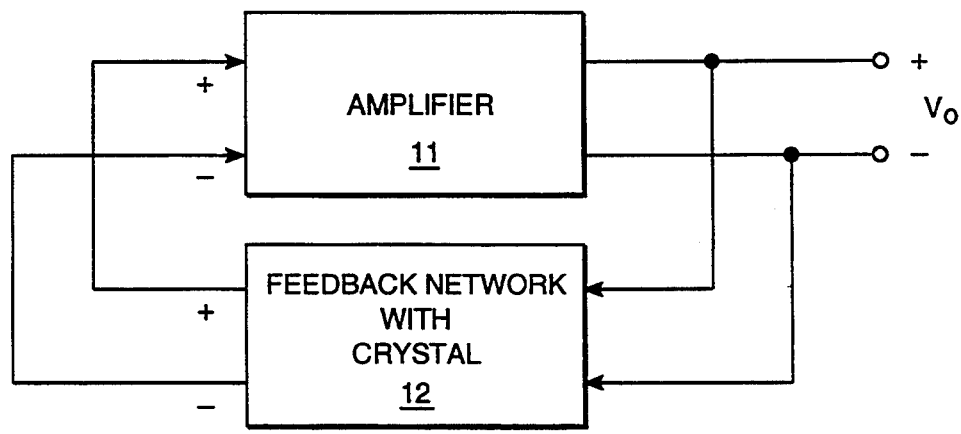

HIGH FREQUENCY CRYSTAL RESONATOR

This is a continuation of application Ser. No. 07/973,025 filed Nov. 6, 1992, now abandoned.

BACKGROUND OF THE INVENTION

This invention relates to crystal resonators and, more particularly, to a high frequency crystal resonator with a resonating frequency on the order of 30 MHz or greater.

Crystal resonators i.e., monocrystalline resonators, are used in a variety of timing dependent applications, such as in computers. Computers are capable of executing multiple tasks simultaneously. Yet such execution typically involves sharing buses, memory, and other common structures. Computers are therefore synchronized to a high frequency clock signal to maintain data integrity. Crystal resonators are used in computers to generate the clock signals for maintaining synchronous operations.

The resonator is part of an oscillating circuit. The oscillator circuit generally comprises a piezoelectric crystal, a housing for protecting the crystal, and an amplifier-feedback loop combination capable of sustaining oscillation.

When a voltage is applied between certain faces of a piezoelectric crystal, a mechanical distortion is produced within the crystal. This phenomenon is known as the "piezoelectric effect". If the oscillator circuit is driven by an alternating current, the piezoelectric crystal is excited to a vibrating state at the frequency of the alternating current. When the oscillator circuit is energized, electrical noise will begin to excite the crystal at its natural resonant frequency. The crystal's output is then amplified and the amplified signal is fed back to the crystal. This causes the amplified signal to build up in strength at the resonating frequency of the crystal, until saturation of the circuit elements causes the overall loop gain in the circuit to fall to unity. This signal is fed to the output terminal of the oscillator.

Although a variety of piezoelectric materials may be used for a resonator, quartz crystal offers certain advantages. It has low internal mechanical loss when used as a vibrator. Another important feature of quartz is that its frequency of vibration is highly stable with changes in temperature and over long periods of time.

A resonator is formed from quartz by first cutting the quartz into slabs, grinding the slabs to a desired thickness by a lapping process, and then polishing the slab surfaces. The choice of cut is usually dictated by the range of operating frequencies and temperatures required for a particular application. Resonators with a particular oblique cut, such as AT, SC or BT, display negligible frequency variation with changes in temperature. These resonators are generally referred to as thickness shear resonators, and are useful for making high frequency oscillators on the order of 30 MHz or greater. The resonant frequency is approximately inversely proportional to the thickness of the wafer in the area of the vibration, so higher frequency devices require thinner wafers.

Single crystal quartz must be ground down to a very thin membrane to enable high oscillating frequencies. However, a thin membrane is a poor structure for attaching the resonator to the housing. It is therefore desirable to produce a resonator with both a vibrating membrane region and a thicker region, the latter region serving as a support structure for attachment purposes.

One such crystal resonating structure used in high frequency resonators is referred to as an "inverted mesa structure". Inverted mesa structure is a term of art referring to a crystal resonating structure having a thin central membrane completely surrounded by a thicker support structure. Electrodes are deposited on the membrane to allow the application of electrical energy to it to cause it to vibrate.

Inverted mesa structures have at least two disadvantages. First, the oscillating wave traveling outward from the electrode region of the membrane must diminish to a very low amplitude by the time it reaches the support structure. The membrane area must therefore be large relative to the electrode area to avoid undesirable damping of the resonance. Additional area is needed for the thicker supporting region, placing a physical constraint on the minimum size of the resonator.

Second, the fabrication process for inverted mesa structures is time-consuming and costly, since each crystal must be individually etched to the precise thickness necessary for high frequency applications.

The resonating circuit of a crystal oscillator typically comprises a pair of electrodes plated on opposing sides of the crystal. The anisotropy of AT crystal inverted mesa structures fabricated using liquid quartz etchants causes edges joining the membrane to the support structure to form irregular angles to the membrane's surface. When the angle formed is acute, the application of a continuous metallic layer from one level to the next becomes difficult.

SUMMARY OF THE INVENTION

The invention is a high frequency crystal resonator utilizing a quartz thickness shear resonating structure etched in such a manner as to form a resonating crystal membrane cantilevered from a thicker crystal support structure.

In contrast to inverted mesa structures, the support structure does not surround the etched membrane. Rather, the membrane is cantilevered from a crystal support structure, i.e., the crystal support structure borders only one side of the membrane and provides a base from which the membrane projects. Consequently, a smaller support structure can be provided, enabling smaller resonator dimensions than are possible with inverted mesa structures having similar sized membranes. Another major advantage of a cantilever arrangement of the invention is that it enables mounting to be relatively free from mechanical stress.

In addition, the present invention is etched in a manner to facilitate the application of electrodes extending from the support structure to the membrane. Continuous metallization is achieved by shaping and orienting the support structure so that at least one edge of the support structure is sloped on each face at an obtuse angle to the membrane. The sloped edge provides a ramp transition from one level of the crystal resonator to the next, thus avoiding gaps in continuity which could result from metallization over acute angles.

Other features and advantages of the invention either will become apparent or will be described in connection with the following, more detailed description of preferred embodiments of the invention.

BRIEF DESCRIPTION OF THE DRAWING

With reference to the accompanying drawing:

FIG. 1 is an exploded perspective view of a preferred embodiment of the invention broadly made up of a crystal resonator having a U-shaped crystal support structure, a cantilevered resonating membrane, a sloped edge between the support structure and membrane, and conductive elements and electrodes on opposing sides of the resonator;

FIG. 2(a) is a top plan view of the quartz crystal of FIG. 1 prior to application of electrodes and having a U-shaped support structure with a sloped edge, and thin and thick layers of conductive elements. Dashed lines indicate the placement of conductive elements on the opposing face;

FIG. 2 (b) is a lateral end view corresponding to the top plan view of FIG. 2 (a);

FIG. 2 (c) is a longitudinal side view corresponding to the top plan view of FIG. 2 (a);

FIG. 3(a) is a top plan view of a quartz crystal after the application of electrodes and having a U-shaped support structure with a sloped edge, thin and thick layers of conductive elements, and two electrodes extending from the support structure to the membrane over the sloped edge (dashed lines indicate the placement of conductive elements and an electrode on the opposing face);

FIG. 3 (b) is a lateral side view corresponding to the top plan view of FIG. 3 (a);

FIG. 3 (c) is a longitudinal side view corresponding to the top plan view of FIG. 3 (a);

FIG. 4 is a top plan view of a resonator having three electrodes (dashed lines indicate the placement of one electrode on the opposing face);

FIG. 5 is a top plan view of a plurality of crystals connected to the crystal wafer during the fabrication process and prior to breakout;

FIG. 6 is a cross-sectional view of a packaged crystal resonator of the invention; and FIG. 7 is a block diagram of a simple oscillator circuit having an amplifier and a feedback circuit including a crystal resonator.

DETAILED DESCRIPTION OF THE PREFERRED EMBODIMENT(S)

The following relatively detailed description is provided to satisfy the patent statutes. However, it will be appreciated by those skilled in the art that various changes and modifications can be made without departing from the invention. The following description is exemplary, rather than exhaustive.

The preferred embodiment is a high frequency crystal resonator utilizing a quartz thickness shear resonator etched in such a manner as to form a resonating crystal membrane cantilevered from a thicker U-shaped crystal support structure. The shape of the support structure is joined to the membrane by a sloped edge for facilitating the application of electrodes (resonating means). The crystal resonator is fabricated using the following method.

A wafer of AT cut quartz is mounted to a smooth, highly flat surface such as glass. Grinding apparatus is used to lap the wafer to a thickness corresponding to the desired frequency of the resonators being produced.

In a first metallization step, both sides of the wafer are coated with a thin layer of conductive metal. In a preferred embodiment, gold and a chromium adhesion layer are applied to the wafer by evaporation. Gold displays good conductivity and favorable masking characteristics, although other conductive metals may be substituted without changing the nature of the invention. The presence of chromium improves the adhesion of the gold to the quartz crystal ($SiO_2$). The use of adhesion layers is well known and need not be disclosed in further detail.

The wafer is then etched to define a plurality of resonator shapes. In a preferred embodiment, a pattern of resonator shapes such as those represented in FIG. 5 is masked onto the wafer and metal etched using standard photolithographic and etching techniques.

FIG. 2(a) depicts one of the resonator shapes 1, which are generally rectangular and oriented so that their shorter sides are parallel to the x-axis of the crystal. Alternatively, the resonator shapes are disposed so that their longer sides are parallel to the x-axis, but the former orientation provides better definition of the edges and mounts of the device.

Two thin gold contacts 4 and 4' are located on both sides of each resonator on a region of the crystal that will eventually form the resonator support structure 3.

In this embodiment, a thicker layer of gold is plated onto the gold contacts at the posterior region of each resonator, forming two contact pads 5 and 5'. The contact pads are applied prior to chemical etching and provide rigidity and strength at the resonator's point of attachment to the wafer. This point of attachment can be observed in FIG. 5. Artisans would recognize that this gold layer is optional. It should be understood that conductive metals other than gold may be used, and may be applied by methods other than plating without departing from the spirit of the invention.

Next, the wafer is chemically etched through the crystal to further define the resonator shapes. A chemical etch of the metal layer is performed to provide the image of the membrane of each resonator. A second quartz etch is then performed to carve out the membranes.

AT cut crystals have the tendency to form slanted angles during chemical etching. Where these angles are acute or right, continuous metallization from one level of the crystal to the next becomes difficult. It is therefore desirable to shape the aforementioned support structure so that at least one edge on each face between the membrane and support structure will be obtuse. In a preferred embodiment, the support structure 3 is U-shaped. In this U-shaped configuration, the crystal forms slopes 6 and 6' on the inside edges of the U-shaped support structure 3. These edges 6 and 6' each provide a gradual slope or ramp between the support structure 3 and the membrane 2, thus facilitating metallization later in the process. Shapes other than the U-shape may be used which result in at least one ramp on each side of the resonator between the support structure and the membrane, such as round or V-shape. Chemical etching techniques are well-known and need not be described further.

After the membranes 2 are formed, the wafer is probed to obtain a sampling of membrane resonating frequencies across the wafer. In the preferred embodiment, membranes are sampled with a probe arrangement to obtain a range of frequencies representative of the wafer. If the range of frequencies falls below the desired frequency, the wafer is further etched to reduce membrane thicknesses.

Once corrective etching is complete, resonating means are applied to each resonator. In the preferred embodiment, another coating of thin gold with a chromium adhesion layer is applied to the resonator extending from the U-shaped support structure 3 to the membrane 2 over the sloped edges 6 and 6'. This gold-chromium layer forms a contact 13 electrically coupling one of the pads 4 on one side of the resonator to a corresponding gold contact pad 4' on the opposing side. Aluminum electrodes 7 and 7' are then provided on opposing sides of the resonator. They are applied overlapping the gold-chromium metallization, using standard masking and etching techniques well-known to artisans. Other means of applying the electrodes may be used, and other conductive materials may be substituted for the aluminum. Furthermore, it should be understood that resonating means other than a pair of electrodes may be used without changing the nature of the invention. For example, the resonator of the embodiment shown in FIG. 4 has two electrodes 7 and 7' on one face, and a third electrode 7" on the opposing face. This type of electrode configuration is designed for use as monolithic a crystal filter.

Once the resonating means has been applied, each crystal resonator is again probed to measure its resonating frequency with the resonating means in place. Resonators with frequencies and/or electrical parameters falling outside of an acceptable range are marked and later discarded.

Unmarked crystal resonators are broken out of the wafer and packaged as depicted in FIG. 6. First, each resonator is mounted to a header 8. Lead terminals 9 from the header are coupled to the resonating means 7 by conductive epoxy or other coupling means. A final frequency measurement is taken for each resonator and fine-tuning is performed, by adding mass to the membrane for example. The crystal is then encapsulated by a lid sealed to the header. In a preferred embodiment, the crystal resonator is covered with a cylindrical cap 10 hermetically sealed to the header. The container provides protection to the crystal from moisture and contamination. Methods for mounting and sealing crystal resonators are well-known in the art and need not be discussed in detail.

The packaged resonator is then incorporated into an oscillator circuit (FIG. 7), including an amplifier 11 to amplify the oscillating waveform generated by the crystal, and a feedback circuit 12 for feeding the amplifier output back through the resonator and into the amplifier input until the amplifier is saturated and stable oscillation is achieved.

As mentioned at the beginning of the detailed description, applicant is not limited to the specific embodiments described above. Various changes and modifications can be made. The claims, their equivalents and their equivalent language define the scope of protection.

What is claimed is:

1. In a high-frequency, thickness shear mode resonator, a resonating structure comprising:
    a support structure having a monocrystalline substrate providing a pair of opposed, generally flat faces;
    a membrane monolithic with said substrate defining a monocrystalline resonating region which is thinner than the distance between said faces and which when electrically driven vibrates by thickness shear, said membrane being cantilevered from said support structure; and
    at least two electrodes respectively disposed on opposing side surfaces of the resonating structure and extending from the support structure to the resonating region of said cantilevered resonating membrane to provide electrical power to said region for causing thickness shear vibration thereat.

2. The combination of claim 1 wherein the resonating structure is substantially quartz crystal.

3. The combination of claim 1 wherein the resonating structure is generally rectangular.

4. The combination of claim 1, wherein both of said electrodes substantially are aluminum.

5. The combination of claim 1 wherein there are at least three of said electrodes with two of the same on one of said opposing side surfaces.

6. The combination of claim 1 further comprising a contact electrically coupling the electrode on one surface of said resonator to the opposing side surface.

7. The combination of claim 1 further comprising gold conducting elements for coupling said electrodes to a source external to the resonating structure.

8. The combination of claim 7, further comprising an adhesion layer applied to the resonating structure for improving adhesion between the gold and said resonating structure.

9. The combination of claim 8, wherein the adhesion layer is substantially chromium.

10. The combination of claim 1, wherein the resonating membrane is defined by chemical etching.

11. The combination of claim 1, further comprising a header assembly on which the resonating structure is mounted, the header assembly further comprising means for coupling the remainder of the combination to the header assembly, and means for coupling the header assembly to an external source; and means for enclosing said resonating structure hermetically sealed to said header assembly.

12. The combination of claim 11, wherein said enclosure means is a cylindrical metal cap.

13. The combination of claim 1 wherein said resonator has a sloped edge at the joint between the support structure and the membrane, defining a ramp therebetween.

14. The combination of claim 13 wherein said support structure is generally U-shaped and provides said ramp, and said membrane is cantilevered at the open end of the U.

15. In a high-frequency, thickness shear mode resonator, a resonating structure comprising:
    a support structure having a monocrystalline substrate defining a pair of opposed, generally flat faces;
    a resonating membrane cantilevered at the support structure, said membrane having a monocrystalline resonating region which is thinner than the distance between said support structure flat faces and which when electrically driven vibrates by thickness shear; and
    a ramp extending from one face of said support structure to the resonating membrane.

16. The combination of claim 15 wherein the resonating structure is substantially quartz crystal.

17. The combination of claim 15, wherein the support structure has a sloped edge at the joint between the support structure and the resonating membrane defining said ramp therebetween.

18. The combination of claim 17, wherein said support structure is generally U-shaped and provides said ramp, and said resonating membrane is cantilevered at the open end of the U.

19. The combination of claim 15 further comprising at least two electrodes respectively disposed on opposing sides of the resonating region of said membrane, each electrode extending from the support to said resonating region, and wherein said electrodes are substantially aluminum.

20. The combination of claim 15, wherein the resonating membrane is defined by chemical etching.

21. The combination of claim 15, further comprising at least two electrodes respectively disposed on opposing side surfaces of the resonating membrane and extending from the support structure to the resonating region of said membrane to provide electrical power to said region for causing thickness shear vibration thereat, and gold conducting elements for coupling said electrodes of said resonating membrane to a source external to said resonating membrane.

22. The substrate of claim 21, further comprising an adhesion layer applied to the wafer for improving adhesion between the gold and the wafer.

23. The combination of claim 22, wherein the adhesion layer is substantially chromium.

24. A wafer of resonating material comprising:
a plurality of individually defined resonating structures adjacent to one another, each of which includes:
a support structure having a monocrystalline substrate providing a pair of opposed, generally flat faces; and
a resonating membrane monolithic with said substrate and cantilevered therefrom, said membrane having a monocrystalline resonating region;
which is thinner than the distance between said support structure flat faces; and
which when electrically driven vibrates by thickness shear.

25. The wafer of claim 24, wherein the resonating membrane of each resonating structure is defined by chemically etching the wafer.

26. The wafer of claim 25, wherein the wafer is substantially quartz crystal.

27. The wafer of claim 25 wherein each resonating structure is generally rectangular.

28. The wafer of claim 24, wherein each resonating membrane further comprises at least two electrodes disposed on opposing sides of said membrane and extending from the support structure to said resonator region, said electrodes being substantially aluminum.

29. The wafer of claim 24, wherein each resonating structure has at least one sloped edge at the joint between the support structure and the resonating membrane defining a ramp therebetween.

30. The combination of claim 24, wherein said support structure is generally U-shaped and provides said ramp, and said membrane is cantilevered at the open end of the U.

31. The wafer of claim 24, wherein the support structure of each resonating structure has a sloped edge at the joint between the support structure and the resonating membrane defining a ramp therebetween.

* * * * *